(12) United States Patent
Uhlig et al.

(10) Patent No.: US 7,737,631 B2
(45) Date of Patent: Jun. 15, 2010

(54) FLAT PANEL DISPLAY WITH REPELLANT AND BORDER AREAS AND METHOD OF MANUFACTURING THE SAME

(75) Inventors: Albrecht Uhlig, Berlin (DE); Kerstin Nolte, Berlin (DE); Thomas Schrader, Berlin (DE)

(73) Assignee: Samsung Mobile Display Co., Ltd., Yongin (KR)

( * ) Notice: Subject to any disclaimer, the term of this patent is extended or adjusted under 35 U.S.C. 154(b) by 909 days.

(21) Appl. No.: 11/419,258

(22) Filed: May 19, 2006

(65) Prior Publication Data
US 2006/0273716 A1    Dec. 7, 2006

(30) Foreign Application Priority Data

Jun. 2, 2005     (EP) ................................. 05104823
Dec. 2, 2005    (KR) ..................... 10-2005-0116982

(51) Int. Cl.
*H01J 1/62* (2006.01)
*H01J 63/04* (2006.01)

(52) U.S. Cl. ...................... 313/506; 313/498; 313/504; 313/512

(58) Field of Classification Search .......... 313/498–512
See application file for complete search history.

(56) References Cited

U.S. PATENT DOCUMENTS 5,994,836 A * 11/1999 Boer et al. ................... 313/504

| | | | |
|---|---|---|---|
| 6,388,377 B1 | 5/2002 | Kobayashi et al. | |
| 6,656,611 B2 | 12/2003 | Tai et al. | |
| 2002/0004126 A1 | 1/2002 | Honda et al. | |
| 2003/0042849 A1 | 3/2003 | Ogino | |
| 2003/0129321 A1 | 7/2003 | Aoki | |
| 2004/0108809 A1* | 6/2004 | Heo et al. .................... | 313/506 |
| 2004/0195551 A1 | 10/2004 | Endo et al. | |
| 2005/0058840 A1 | 3/2005 | Toyoda | |
| 2006/0273718 A1* | 12/2006 | Wang et al. ................. | 313/512 |

FOREIGN PATENT DOCUMENTS

DE    10311097 A1    11/2003
DE    10236404 A1    2/2004

(Continued)

OTHER PUBLICATIONS

European Search Report dated Nov. 15, 2005.

*Primary Examiner*—Karabi Guharay
*Assistant Examiner*—Kevin Quarterman
(74) *Attorney, Agent, or Firm*—H.C. Park & Associates, PLC (57) ABSTRACT

A flat panel display and a method of manufacturing the same, which allows the formation of an organic film by inkjet printing while avoiding overflow of ink into adjacent areas, thus increasing the uniformity of thickness of the organic film and decreasing manufacturing costs. The flat panel display includes a substrate, a first electrode layer formed on the substrate, ink with material for a light emission layer formed on an active area of the first electrode layer, a repellant area formed of organic material located around the active area, and a border area also formed of organic material located between the active area and the repellant area. A surface energy of the border area is higher than a surface energy of the repellant area.

10 Claims, 4 Drawing Sheets

FOREIGN PATENT DOCUMENTS

| | | |
|---|---|---|
| DE | 10343351 A1 | 5/2005 |
| EP | 0989778 A1 | 3/2000 |
| EP | 0996314 A1 | 4/2000 |
| EP | 1008873 A1 | 6/2000 |
| JP | 09203803 A1 | 8/1997 |
| JP | 09230129 A1 | 9/1997 |
| JP | 2000-353594 | 12/2000 |
| JP | 2002-189290 | 7/2002 |
| JP | 2002-371196 | 12/2002 |
| JP | 2003-241684 | 8/2003 |
| JP | 2004-047215 | 2/2004 |
| JP | 2004-103502 | 4/2004 |
| JP | 2004-127933 | 4/2004 |
| WO | 01-39272 | 5/2001 |
| WO | 03-065474 | 8/2003 |
| WO | 2004-060025 | 7/2004 |
| WO | 2005-036509 | 4/2005 |

* cited by examiner

FIG. 7

FLAT PANEL DISPLAY WITH REPELLANT AND BORDER AREAS AND METHOD OF MANUFACTURING THE SAME

CROSS REFERENCE TO RELATED APPLICATION

This application claims priority to and the benefit of European Patent Application No. 05104823.9, filed on Jun. 2, 2005, and Korean Patent Application No. 10-2005-0116982, filed on Dec. 2, 2005, which are hereby incorporated by reference for all purposes as if fully set forth herein.

BACKGROUND OF THE INVENTION

1. Field of the Invention

The present invention relates to a flat panel display and a method of manufacturing the same, and more particularly, to a flat panel display suitable for patterning performed by inkjet printing and a method of manufacturing the flat panel display.

2. Discussion of the Background

An organic layer with a light-emission layer can be formed as a component of a flat panel display by inkjet printing. In an inkjet printing process, an active material is first dissolved in a solvent to form ink. The ink is then jetted as droplets on an active area of a substrate by a printing process such as piezo printing or bubble-jet printing. Mechanical arrangement can be used to position an ink head corresponding to the desired position of the droplets on the substrate. After the solvent dries, the ink-jetted active material forms a film on the active area.

One main failure of the inkjet printing technique is the overflow of ink droplets into adjacent active areas, which can lead to color mixing.

The inkjet printing technique can be used to manufacture a full-color display with light-emitting polymers (LEPs).

United States Patent Application Publication Number US 2002/0004126 A1 discloses a process in which small drops of an active material, such as a hole-transporting or light-emitting material, are deposited on an active area of a substrate. An active area defines the pixel area, and the dimension of an active area designed for use in high-resolution displays for mobile applications can be in the range of 30 µm by 180 µm. Advanced commercially available inkjet heads are able to generate drops with diameters of about 30 µm or greater. Thus, use of ink drops with this diameter in a high-resolution display may result in ink overflow into neighboring pixels. To prevent this overflow, the substrate surface could be modified.

There are two approaches to modify the substrate surface: one approach is to create a substrate surface with different wetting properties for ink in the active area and outside the active area; the second approach is to form geometrical barriers on the substrate surface to mechanically prevent overflow of the ink outside an active area.

The first fundamental approach of creating a substrate surface with different wetting properties for ink in the active area and outside the active area is disclosed in EP 0989778 A1. The wetting property disclosed in this reference is the surface energy across the substrate. A contrast in surface energy across the substrate is produced by an appropriate selection of materials that form the substrate surface. Print-applied ink can only flow in areas having high surface energy, whereas areas having low surface energy serve as barriers to prevent flow of ink. To obtain a film of inkjetted active material with a homogeneous thickness, a surface with low surface energy can be positioned beyond the boundary of a pixel surface of an organic light emitting diode (OLED). The coating thickness of the film may be homogeneous inside the active area up to the boundary, but then noticeably decline outside an active area around the barriers.

Variation in contrast of the surface energy across the substrate can be achieved in different ways and with different methods.

EP 0989778 A1 discloses two coating structures on a substrate. With a common surface treatment using plasma, an upper coating can be provided with low surface energy, while a lower coating can be provided with high surface energy. The lower coating can be typically formed of an inorganic material, such as silicon oxide or silicon nitride.

Thus, the upper organic coating and lower inorganic coating act as a boundary zone, where the upper coating has low surface energy to repel the ink. Hence, this structure facilitates the deposition of polymer films by inkjet printing.

However, the deposition and structuring of this coating requires processes that are typically used in the semiconductor industry, such as coating separation, sputtering, and gas phase processes including plasma enhanced chemical vapor deposition (PECVD). These processes can be expensive and accordingly can reduce the cost advantage gained by the use of OLED technology. Moreover, the upper coating can form a surface topography since areas with low surface energy have a defined height above the substrate surface. As a result of this height, the polymer film may be formed to an undesirable thickness.

JP 09-203803 AA discloses a chemical treatment of a substrate surface that has been previously treated with photoresist. The photoresist is then exposed to light through a mask and developed. In such a structure, the areas with the photoresist have low surface energy, while areas without photoresist have high surface energy. The flanks of the photoresist structure possess a mean surface energy and thus provide a gradual transition of the surface energy across the flanks. However, the flanks of the photoresist structure do not constitute a defined boundary zone with selectable surface energy and geometry, and have low spatial dissolution capacity.

JP 09-230129 AA discloses a two-stage surface treatment method including treating selected regions of an entire substrate possessing low surface energy with short-wave light (e.g., UV light). The short-wave light increases the surface energy of the selected regions. However, the resulting contrast of the surface energy is limited, and the time-consuming exposure process may not be suitable for mass production.

DE 10236404 A1 discloses surface fluorination of photoresist using $CF_4$, also including a plasma process combined with a liftoff process, for patterning. However, this process requires chemical vapor deposition (CVD), which adds considerable process costs and time. Furthermore, the surface energy changed by surface modification can be unstable over time. This is because fluorinated parts of the photoresist layer may diffuse into the photoresist bulk to maintain equilibrium. Additionally, the fluorinated parts may not chemically adhere to the photoresist bulk and may be washed away after exposure to an acid-containing solution, such as PDOT:PSS, which is commonly used for polymer OLED manufacturing.

DE 10343351 A1 discloses the deposition of a hydrophobic layer, such as the product sold under the trademark Teflon®, which repels ink. Teflon® can be deposited by CVD and patterned by liftoff technologies, laser ablation, or by a shadow mask. However, this technology also requires CVD or thermal evaporation, which both are vacuum-based technologies and require considerable expenses and process time.

U.S. Pat. No. 6,656,611 B2 discloses the use of a polysiloxane-based photoresist to form insulating areas and define active areas of a display. To generate a passive matrix display, polysiloxane can have an overhanging structure to separate cathodes. However, a polysiloxane layer can have a considerable film thickness and can negatively influence a cathode sheet resistance because of metal film separation at the edges of the polysiloxane layer.

EP 1008873 discloses a process of manufacturing a color filter for an LCD display using the inkjet printing technique. The surface energy of a photoactive material can be changed by irradiation to provide shading areas and ink-philic areas where ink for color filters is applied by inkjet printing. Because the photoactive material changes only its surface energy, the photoactive material cannot be used as a barrier to ink flow or pixel defining layer for polymer OLED production directly.

The second approach to prevent overflow is to use geometrical structures that act as a spatial barrier.

U.S. Pat. No. 6,388,377 B1 discloses the positioning of photoresist strips between adjacent active areas. The strips have a height of at least 2 μm and provide a physical barrier to prevent overflow of ink.

EP 0996314 A1 discloses the fabrication of photoresist structures. Because of the boundary limitation of various rows or columns of a full-color display screen formed by photoresist for example, HTL-ink and polymer ink can be printed into pre-structured channels. Thus, red, green, and blue emitting polymers can be printed in a line-shaped manner and adjacent to each other without flowing into neighboring channels or causing color mixing. These photoresist structures form channels with a certain height on a substrate, which is then built up to the full-color display screen. Therefore, no ink flows over the photoresist barriers and into the neighboring lines. The height of the banks of the channels is greater than a thickness of a film to be deposited by inkjet printing. Furthermore, the height of the banks is larger than ½ of the diameter of a drop of ink divided by the width of an active area or pixel. Additionally, the upper surface of the banks can have a semi-circular, triangular, or rectangular sub-structure reservoir to store ink that overflows. Accordingly, a second barrier is provided in addition to the bank structure to avoid overflow of ink into adjacent active areas.

DE 10311097 A1 discloses the use of additional ink stoppers. Because photoresist structures with banks along the channels provide only lateral limitations for ink flow, HTL-ink and polymer ink can flow out of the upper and lower regions of the channels. Therefore, the ink volume in the upper and lower regions of the channels is less than that in the middle regions of the channels. Therefore, when dry, an HTL or polymer film may not have a homogeneous layer thickness. The use of ink stoppers in the upper and lower regions of the channels prevents flow of ink outside of the channels.

US 2003/0042849 A1 discloses another approach to define the drop landing/film formation for inkjet printed devices. Here, a mechanical metal mask is positioned and fixed onto a substrate so an organic emitter can be applied using a spin coating technique. However, the use of a metal shadow mask restricts the size of the substrate since different thermal expansion coefficients between the substrate and the mask may result in misalignment of the desired pattern.

SUMMARY OF THE INVENTION

This invention provides a flat panel display and a method of manufacturing the same, which allows the formation of an organic film by inkjet printing while avoiding overflow of ink into adjacent areas and increasing the uniformity of thickness of the organic film.

Additional features of the invention will be set forth in the description which follows, and in part will be apparent from the description, or may be learned by practice of the invention.

The present invention discloses a flat panel display with a substrate and a first electrode layer formed on the substrate, including an active area defined on a part of the first electrode layer, a repellant area located around the active area and including a first layer; and a border area positioned between the active area and the repellant area and including a second layer. Further, the surface energy of the second layer is higher than a surface energy of the first layer.

The present invention also discloses method of manufacturing a flat panel display, including forming a first organic layer having a predetermined pattern on a substrate having a first electrode layer formed thereon to define an active area and a border area around the active area, and forming a second organic layer on the substrate to define a repellant area. Further, the second organic layer has a surface energy lower than a surface energy of the first organic layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element such as a layer, film, region or substrate is referred to as being "on" another element, it can be directly on the other element or intervening elements may also be present. In contrast, where there are no intervening elements present, an element is referred to as being "directly on" another element.

Figure 1:
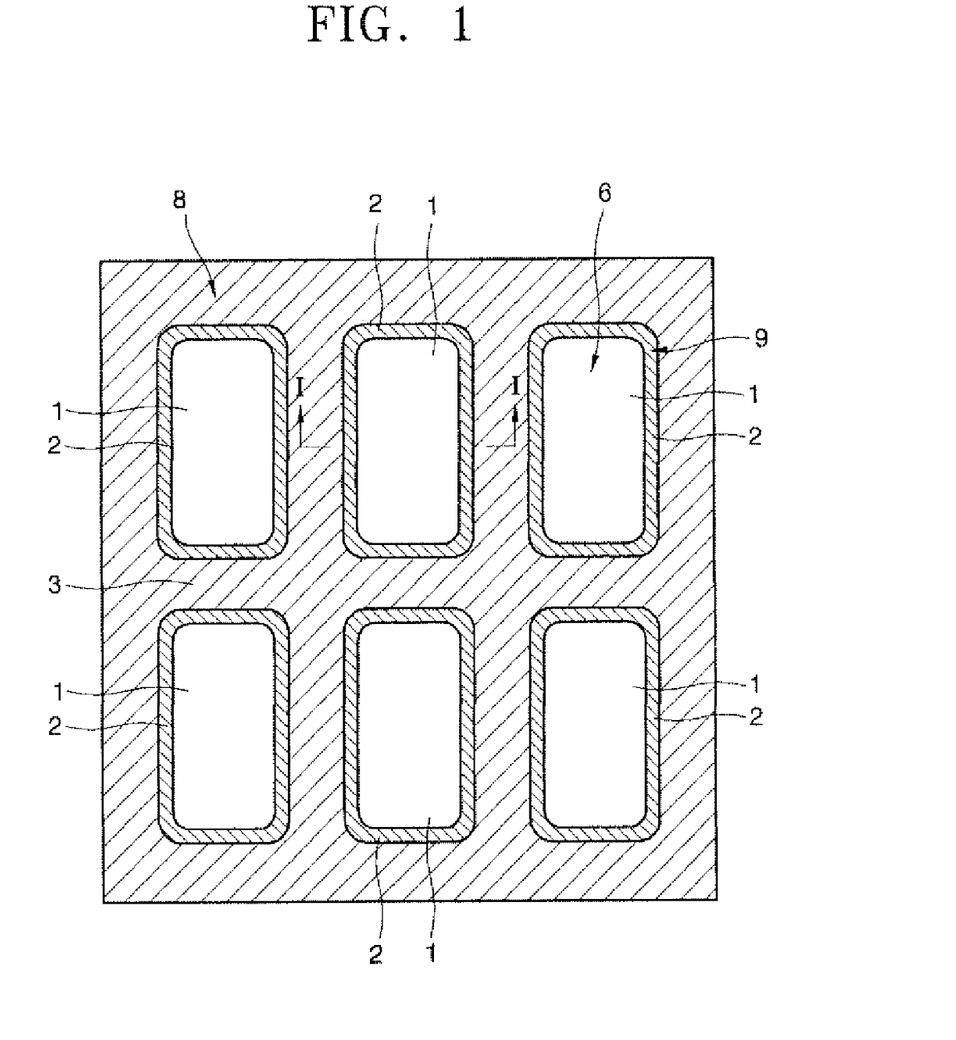
FIG. 1 shows a plan view of a substrate for a flat panel display according to an exemplary embodiment of the present invention.
Figure 2:
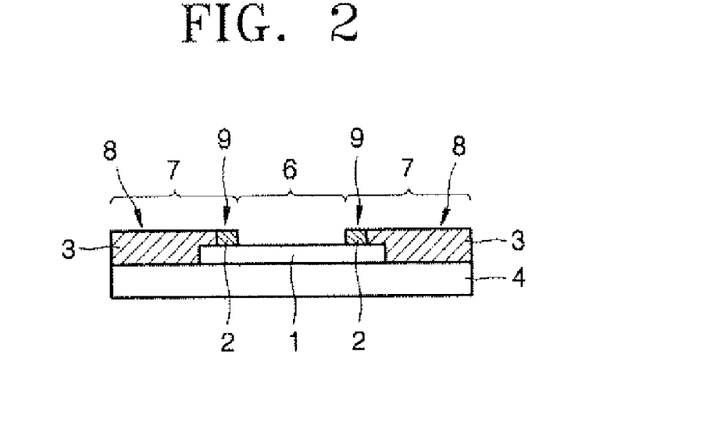
FIG. 2 shows a cross-section cut along line I-I of FIG. 1.

FIG. 1 shows a plan view of a substrate for a flat panel display according to an exemplary embodiment of the present invention. FIG. 2 shows a cross-section cut along line I-I of FIG. 1.

As shown in FIG. 1 and FIG. 2, the substrate includes a ground substrate 4, a first electrode layer 1 formed on the ground substrate 4, and a first organic layer 2 and a second organic layer 3 that cover edges of the first electrode layer 1.

To produce a passive matrix (PM) structure, the ground substrate 4 may be formed of glass, $SiO_xN_y$, plastic, or metal foil and can have a buffer layer (not shown) formed on its upper surface. To produce an active matrix (AM) structure, the ground substrate 4 may include a pixel circuit (not shown) including, among other devices, a Thin Film Transistor (TFT) and a capacitor. A drain electrode or a source electrode of the TFT may be coupled with the first electrode layer 1.

The first electrode layer 1 is formed on the ground substrate 4. To produce a PM structure, the first electrode layer 1 may be arranged in strips or dots. To produce an AM structure, the first electrode layer 1 may be partitioned according to pixels. The first electrode layer 1 may be a transparent electrode or a reflective electrode. When the first electrode layer 1 is a transparent electrode, it may be formed of ITO, IZO, ZnO, or $In_2O_3$. When the first electrode layer 1 is a reflective electrode, it may be a multi-layered structure including a layer of metal, for example Al or Ag, and a layer of a transparent material, for example ITO, IZO, ZnO, and $In_2O_3$.

A plurality of active areas 6 are defined on the first electrode layer 1. An organic material, including a material to form a light emission layer, is printed by inkjet printing into the plurality of active areas 6.

The first organic layer 2 and second organic layer 3 can be formed on the ground substrate 4 along the edges of the first electrode layer 1.

The first organic layer 2 can be formed of an organic material with a high surface energy of more than 40 $mJ/m^2$ along the boundaries of the active areas 6 on the first electrode layer 1. The second organic layer 3 can be formed of an organic material with a low surface energy of less than 30 $mJ/m^2$ in an inactive area 7. Inactive area 7 includes a region other than the active areas 6. The second organic layer 3 forms a repellant area 8 adjacent to the active areas 6 and between and separating adjacent active areas 6. The first organic layer 2 forms a border area 9 around the active area 6 and between the repellant area 8 and the active area 6.

The first organic layer 2 and the second organic layer 3 may be formed of a photosensitive organic material and patterned by photolithography or may be directly deposited on the ground substrate 4 without patterning.

Figure 3:
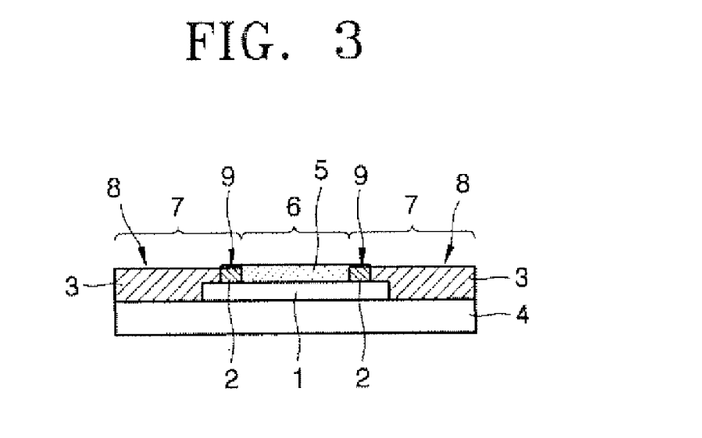
FIG. 3 shows a cross-section of a substrate resulting from the deposition and drying of ink in the active area of the substrate of FIG. 2.
Figure 4:
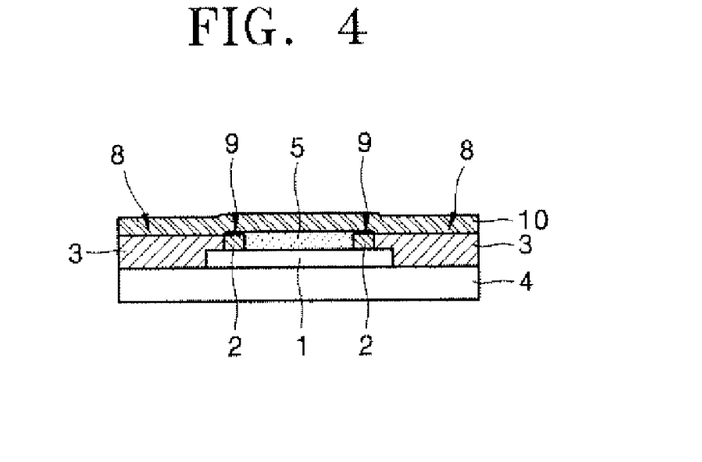
FIG. 4 shows a cross-section of a substrate resulting from the formation of a second electrode layer on the substrate of FIG. 3.

In this exemplary embodiment, the first organic layer 2 and the second organic layer 3 are disposed side by side. One surface of the first organic layer 2 laterally contacts one surface of the second organic layer 3. As shown in FIG. 2, FIG. 3, and FIG. 4, top surfaces of the first organic layer 2 and the second organic layer 3 are planar and have the same height above the ground substrate 4. Therefore, the sum of thicknesses of the first electrode layer 1 and the first organic layer 2 equals the thickness of the second organic layer 3.

With the structure of this exemplary embodiment, when ink, which includes a material for a light emission layer (EML), is printed by inkjet printing in the active area 6 and dried, an organic film 5 with a uniform thickness as shown in FIG. 3 can be obtained. The organic film 5 includes an EML and may further include at least one of a hole injection layer (HIL), a hole transport layer (HTL), an electron injection layer (EIL), and an electron transport layer (ETL).

Figure 5:
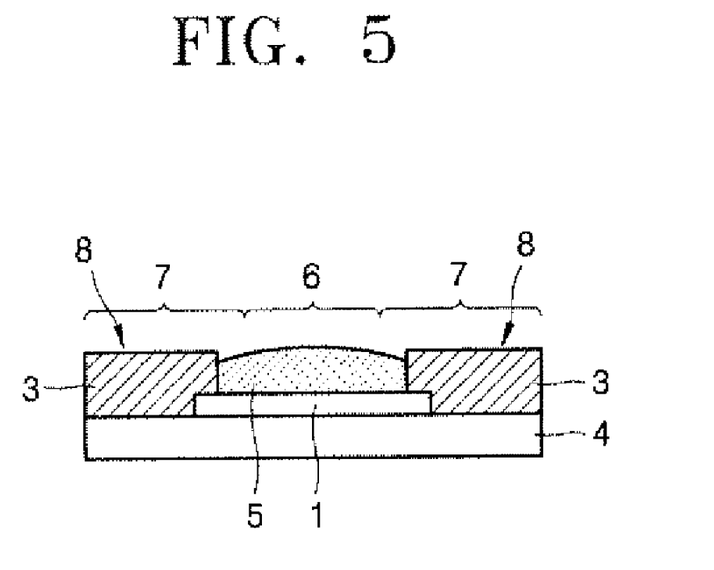
FIG. 5 shows a cross-section of a conventional substrate (comparative example) after ink is printed and dried.

The repellant area 8 exerts a repellant force on ink, and is formed by the second organic layer 3 on the edge of the active area 6 to prevent overflow of the ink into adjacent active areas 6. The border area 9 has a smaller repellant force than the repellant area 8, and is formed by the first organic layer 2, positioned between the active area 6 and the repellant area 8. The first organic layer 2 has a higher surface energy than that of the second organic layer 3. The border area 9 catches ink that overflows from the active area 6 towards the repellant area 8, so the dried organic film 5 has a uniform thickness.

Where no border area 9 formed by the first organic layer 2 exists, as in a conventional substrate (comparative example) shown in FIG. 5, the organic film 5 has a convex structure in which the center portion is thicker than the peripheral portion. The active area 6 is defined only by the repellant area 8, and ink is pushed toward the center portion of the active area 6 by a high repellant force between the water-based ink and the second organic layer 3 produced along the edges of the second organic layer 3. Therefore, even though ink in the active area 6 does not overflow into neighboring active areas, the dried organic film 5 has a variable thickness across the active area 6, as shown in FIG. 5, thus reducing the quality of the substrate.

The first organic layer 2 and second organic layer 3 may have thicknesses ranging between 100 nm and 20 μm. When the first organic layer 2 and second organic layer 3 are less than 100 nm thick, preventing ink overflow may be difficult. When the first organic layer 2 and second organic layer 3 are more than 20 μm thick, the thickness of the entire display device can increase, and a step difference between a top surface of the organic film 5 and a top surface of the second organic layer 3 may result in excessive step differences in a second electrode layer 10 formed thereon.

The first organic layer 2 and second organic layer 3 may be formed of a photosensitive organic material such as photoresist. The photosensitive organic material can be deposited on the ground substrate 4 by spin coating or screen printing, hardened, and exposed and developed, thereby forming a pattern. After the pattern formation, the pattern may be more firmly hardened by hard baking. The hardening of the first organic layer 2 may be performed by baking between 100° C. to 140° C. for 1-5 minutes. The exposure of the first organic layer 2 may be performed at an energy density of between 60-120 $mJ/cm^2$. The hardening of the second organic layer 3 may be performed by baking between 140° C. to 240° C. for 10-40 minutes. The exposure of the second organic layer 3 may be performed at an energy density of between 300-700 $mJ/cm^2$.

The surface energy of the first organic layer 2 may be additionally increased by undergoing UV/ozone treatment.

After the formation of the organic film 5 having a substantially uniform thickness, the second electrode layer 10 can formed on the entire surface of the organic film 5 as shown in FIG. 4.

To produce a PM structure, the second electrode layer 10 may include strips formed to cross orthogonally with the strips of the first electrode layer 1, or the second electrode layer 10 may cover all of the active areas 6 as a single layer. To produce an AM structure, the second electrode layer 10 may be formed to cover all of the pixels. Similar to the first electrode layer 1, the second electrode layer 10 may also be a transparent electrode or a reflective electrode. When the second electrode layer 10 is a transparent electrode, it may be formed of a semi-transparent body, such as a thin Ag film, or formed with a multi-layered structure including metal such as Al or Ag, and a transparent material such as ITO, IZO, ZnO, or $In_2O_3$. When the second electrode layer 10 is a reflective electrode, it may be formed of metal, for example Al or Ag, to have a single-layered or multi-layered structure.

Figure 6:
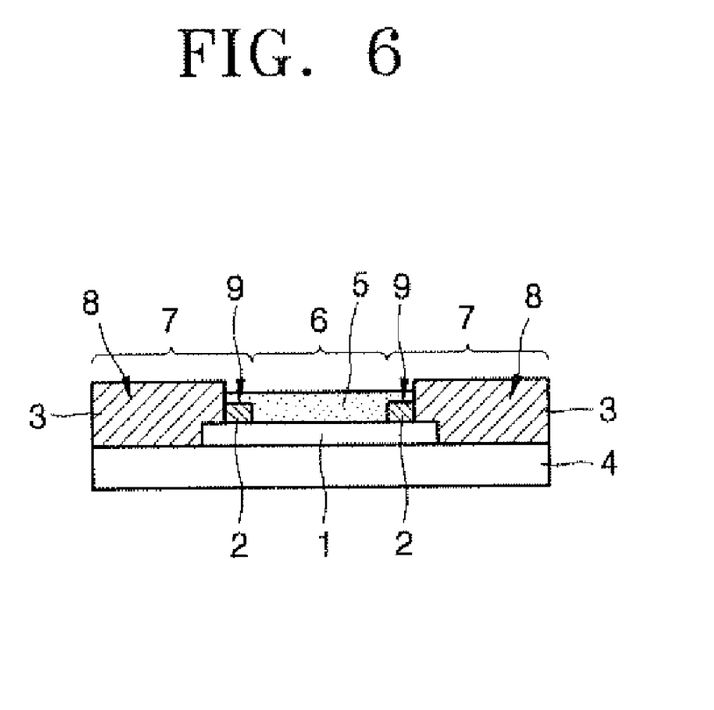
FIG. 6 shows a cross-section of a substrate for a flat panel display according to another exemplary embodiment of the present invention.

In another exemplary embodiment shown in FIG. 6, the border area 9 formed by the first organic layer 2 may have a lower height than the repellant area 8. That is, the sum of the thicknesses of the first electrode layer 1 and the first organic layer 2 may be less than the thickness of the second organic layer 3. As shown in FIG. 6, the border area 9 is covered by ink. Thus, the first organic layer 2 catches ink repelled from the edges of the second organic layer 3 to form a more uniform organic film 5 thickness.

Figure 7:
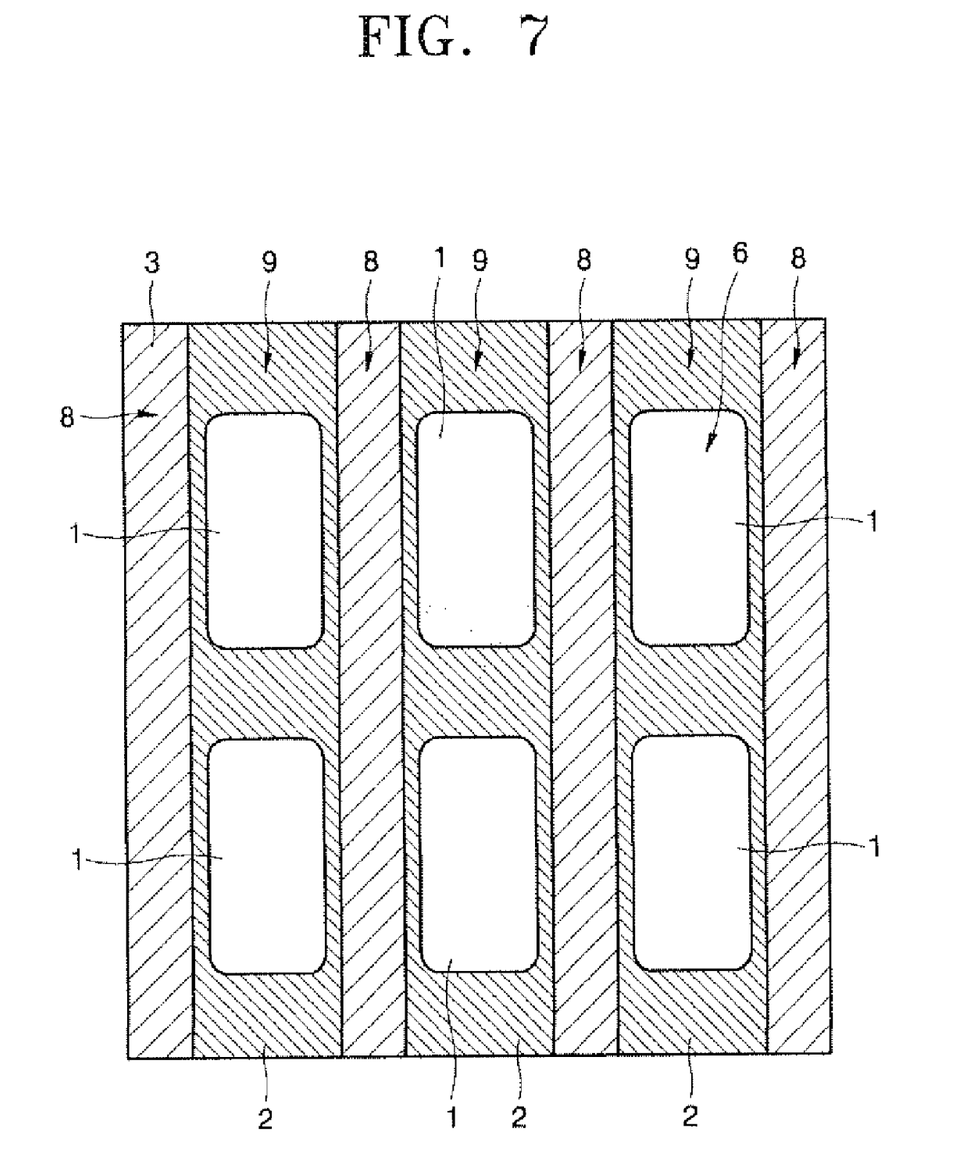
FIG. 7 shows a plan view of a substrate for a flat panel display according to another exemplary embodiment of the present invention.

The first organic layer 2 and second organic layer 3 may be patterned in additional arrangements to achieve a more uniform organic film 5 thickness. FIG. 7 shows another exemplary embodiment of the patterns of the first organic layer 2 and second organic layer 3.

As shown in FIG. 7, the second organic layer 3 may be arranged in strips with strip-shaped openings, and the first organic layer 2 with dot-patterned openings can be formed in the openings of the second organic layer 3 as shown in FIG. 2 or FIG. 6. When forming this exemplary embodiment by inkjet printing, an inkjet head can print ink while moving along the strip-shaped openings. Thus, a single color of ink can be coated and dried between the strip-shaped openings of the second organic layer 3 to form an organic film 5 with a substantially uniform thickness in the active areas 6. In this exemplary embodiment, as with the first exemplary embodiment, repellant area 8 is positioned adjacent to the active area 6, and border area 9 is located around the active area 6.

Exemplary Embodiment

The substrate of FIG. 2 can be manufactured as described below.

First, indium tin oxide (ITO), the first electrode layer 1, is formed on soda line glass, the ground substrate 4. The ITO is then structured to form a grid for a PM device according to standard technologies. The ground substrate 4 is wet cleaned with high-pressure deionized water, megasonic deionized water, and isopropyl alcohol (IPA) puddle process. A puddle process includes dispensation of a developer or other media onto the ground substrate 4 until the ground substrate 4 is completely wetted. The puddle process can be performed under slow rotation, and can remain on the ground substrate 4 for a predetermined time without rotation.

Next, the resultant ground substrate 4 is treated with UV/ozone for 15 minutes at an energy density of 18 mW/cm$^2$.

Thereafter, a photoresist, such as SL 1104-4 of Toray Industries Inc., is applied by spin coating to form a 1 μm-thick continuous film. The continuous film is exposed and developed to form the first organic layer 2 with a pattern shown in FIG. 1 or FIG. 7. The photoresist may be a positive tone resin that allows non-exposed areas of the continuous film to remain on the ground substrate 4 and exposed areas to be dissolved by a developer. The surface energy of the photoresist equals 40 mJ/m$^2$ and increases to 70 mJ/m$^2$ after UV/ozone treatment.

After soft baking at 120° C. for 3.5 minutes and exposure with an energy density of 90 mJ/m$^2$, the resultant ground substrate 4 is treated with a mixture of a developer, such as AZ MIF 726 of Clariant Inc., and water at a ratio of 1:3 using a puddle process to develop a desired photoresist structure for the first organic layer 2. This developing operation is followed by hard baking at 230° C. for 15 minutes and then 160° C. for 15 minutes.

Then, the resultant ground substrate 4 is cleaned using megasonic deionized water according to the IPA puddle process and treated with UV/ozone for 15 minutes.

Next, another photoresist, such as WL 5150 of Dow Corning, is applied to the ground substrate 4 by spin coating to form a 1 μm-thick continuous film. The photoresist may be negative tone resin that allows non-exposed areas of the continuous film to be dissolved by a developer and exposed areas to remain on the ground substrate 4. The surface energy of the photoresist equals 27 mJ/m$^2$.

After soft baking at 110° C. for 3 minutes and exposure with an energy density of 500 mJ/m$^2$, the resultant ground substrate 4 is treated with mesitylene produced by Roth as a developer using a puddle process to develop a desired photoresist structure for the second organic layer 3. This developing operation is followed by hard baking at 230° C. for 30 minutes.

According to exemplary embodiments of the present invention, a flat panel display having a high contrast obtained by inkjet printing can be obtained by selecting a material having a predetermined surface energy. A simple deposition technology allowing a low cost process can be provided. Additional adhesion problems or mechanical stress do not occur because two different materials, namely, a first layer and a second layer, are not stacked on each other. Step differences may be avoided upon formation of a second electrode layer. A lowered overall film thickness reduces the quantity of gas emitted, which may be harmful to OLED lifetime. No vacuum process technologies are required to adjust the surface energy of a substrate. No further surface treatments are required to generate surface energy contrasts.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A flat panel display with a substrate and a first electrode layer formed on the substrate, comprising:
   an active area defined on a part of the first electrode layer;
   a repellant area positioned adjacent to the active area and comprising a first layer; and
   a border area positioned between the active area and the repellant area and comprising a second layer,
   wherein a surface energy of the second layer is higher than a surface energy of the first layer, and
   wherein a top surface of the first layer and a top surface of the second layer are equidistant from a top surface of the substrate.

2. The flat panel display of claim 1, wherein the second layer is arranged on the first electrode layer.

3. The flat panel display of claim 1, wherein the first layer covers an edge of the first electrode layer.

4. The flat panel display of claim 1, wherein the first layer and the second layer comprise an organic material.

5. The flat panel display of claim 1, wherein the first layer and the second layer comprise a photosensitive material.

6. The flat panel display of claim 1, wherein the first layer and the second layer have thicknesses between about 100 nm and about 20 μm.

7. The flat panel display of claim 1, further comprising a material for a light emission layer arranged on a portion of the active area.

8. The flat panel display of claim 1, further comprising:
a thin film transistor with a source electrode and a drain electrode,
wherein the source electrode or the drain electrode is coupled with the first electrode layer.

9. The flat panel display of claim 1, wherein the repellant area is positioned around the active area.

10. The flat panel display of claim 1, further comprising a second electrode layer arranged on the active area.

\* \* \* \* \*